United States Patent
Huo et al.

(10) Patent No.: US 9,190,476 B2
(45) Date of Patent: *Nov. 17, 2015

(54) HIGH VOLTAGE AND ULTRA-HIGH VOLTAGE SEMICONDUCTOR DEVICES WITH INCREASED BREAKDOWN VOLTAGES

(71) Applicant: TAIWAN SEMICONDUCTOR MANUFACTURING CO., LTD., Hsin-Chu (TW)

(72) Inventors: Ker Hsiao Huo, Taichung (TW); Ru-Yi Su, Kouhu Township (TW); Fu-Chih Yang, Fengshang (TW); Chun Lin Tsai, Hsin-Chu (TW); Chih-Chang Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/705,007

(22) Filed: May 6, 2015

(65) Prior Publication Data

US 2015/0263164 A1    Sep. 17, 2015

Related U.S. Application Data

(63) Continuation of application No. 14/333,886, filed on Jul. 17, 2014, now Pat. No. 9,035,379, which is a continuation of application No. 13/186,660, filed on Jul. 20, 2011, now Pat. No. 8,803,232.

(60) Provisional application No. 61/491,217, filed on May 29, 2011.

(51) Int. Cl.
*H01L 29/40*   (2006.01)
*H01L 29/78*   (2006.01)

(Continued)

(52) U.S. Cl.
CPC .......... *H01L 29/404* (2013.01); *H01L 29/0607* (2013.01); *H01L 29/0615* (2013.01); *H01L 29/0649* (2013.01); *H01L 29/0869* (2013.01);

(Continued)

(58) Field of Classification Search
None
See application file for complete search history.

(56) References Cited

U.S. PATENT DOCUMENTS 6,110,804 A    8/2000   Parthasarathy et al.
6,150,702 A    11/2000  Funaki et al.

(Continued)

OTHER PUBLICATIONS

Suzuki, "3-D Effect of Cell Designs on the Breakdown Voltage of Power SOI-LDMOS," Proceedings IEEE International SOI Conference, Oct. 1996, pp0. 134-135.

*Primary Examiner* — Andres Munoz
(74) *Attorney, Agent, or Firm* — Duane Morris LLP

(57) ABSTRACT

A lateral DMOS transistor is provided with a source region, a drain region, and a conductive gate. The drain region is laterally separated from the conductive gate by a field oxide that encroaches beneath the conductive gate. The lateral DMOS transistor may be formed in a racetrack-like configuration with the conductive gate including a rectilinear portion and a curved portion and surrounded by the source region. Disposed between the conductive gate and the trapped drain is one or more levels of interlevel dielectric material. One or more groups of isolated conductor leads are formed in or on the dielectric layers and may be disposed at multiple device levels. The isolated conductive leads increase the breakdown voltage of the lateral DMOS transistor particularly in the curved regions where electric field crowding can otherwise degrade breakdown voltages.

20 Claims, 5 Drawing Sheets

(51) Int. Cl.
  *H01L 29/06* (2006.01)
  *H01L 29/08* (2006.01)
  *H01L 29/10* (2006.01)
  *H01L 29/66* (2006.01)

(52) U.S. Cl.
  CPC ........ *H01L 29/0886* (2013.01); *H01L 29/1095* (2013.01); *H01L 29/66681* (2013.01); *H01L 29/7816* (2013.01)

(56) References Cited

U.S. PATENT DOCUMENTS

| | | |
|---|---|---|
| 6,246,101 B1 | 6/2001 | Akiyama |
| 6,307,232 B1 | 10/2001 | Akiyama |
| 6,525,390 B2 | 2/2003 | Tada et al. |
| 6,593,621 B2 | 7/2003 | Tsuchiko et al. |
| 6,603,176 B2 | 8/2003 | Akiyama |
| 7,741,662 B2 | 6/2010 | Kao |
| 7,955,943 B2 | 6/2011 | Hall et al. |
| 8,120,064 B2 | 2/2012 | Parikh et al. |
| 8,803,232 B2 | 8/2014 | Huo et al. |
| 9,035,379 B2 * | 5/2015 | Huo et al. ............... 257/335 |
| 2001/0004124 A1 | 6/2001 | Noda et al. |
| 2002/0135019 A1 | 9/2002 | Noda |
| 2004/0251499 A1 | 12/2004 | Yamaguchi et al. |
| 2007/0057293 A1 | 3/2007 | Kao |
| 2008/0203496 A1 | 8/2008 | Takahashi |
| 2009/0039425 A1 | 2/2009 | Shu et al. |
| 2010/0163987 A1 | 7/2010 | Nakagawa |

* cited by examiner

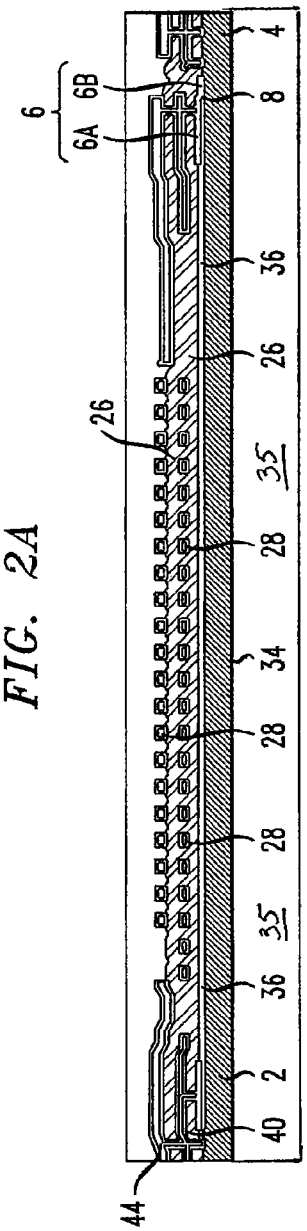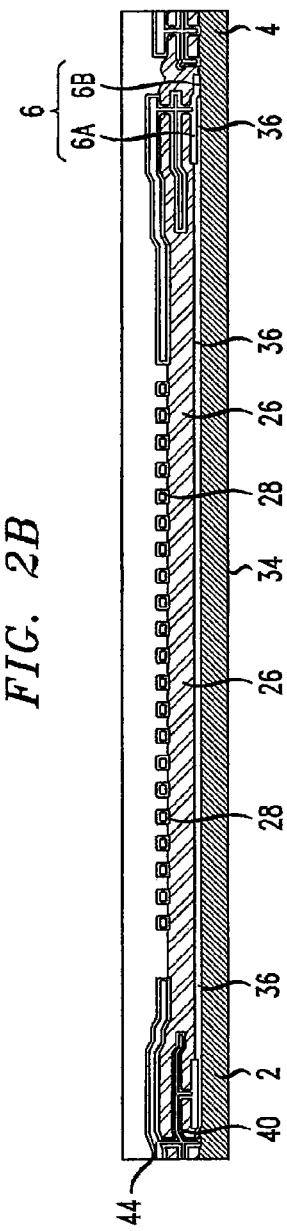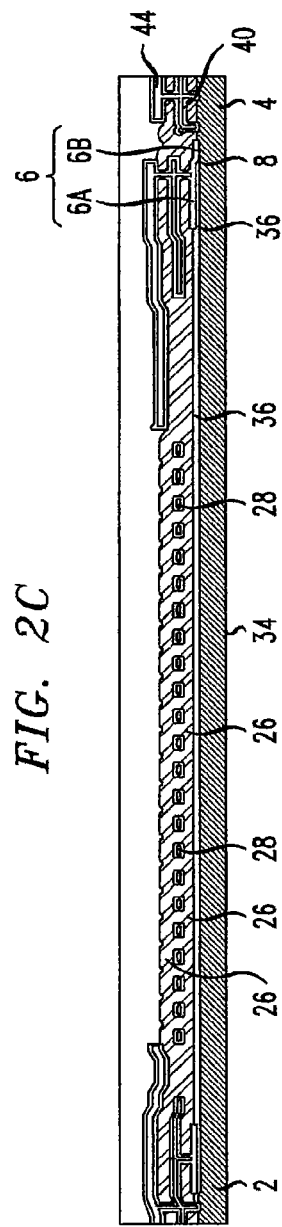

BV = 800V

BV = 900V

BV = 950V

HIGH VOLTAGE AND ULTRA-HIGH VOLTAGE SEMICONDUCTOR DEVICES WITH INCREASED BREAKDOWN VOLTAGES

RELATED APPLICATION

This application is a continuation of U.S. patent application Ser. No. 14/333,886, filed on Jul. 17, 2014, which is a continuation of U.S. patent application Ser. No. 13/186,660, filed on Jul. 20, 2011, which is related to and claims priority of U.S. Provisional Application No. 61/491,217, filed May 29, 2011, the contents of each of which are hereby incorporated by reference as if set forth in their entireties.

TECHNICAL FIELD

The disclosure relates to lateral double-diffused metal-oxide-semiconductor (LDMOS) transistors and, in particular, to high voltage (HV) LDMOS transistors with increased breakdown voltages.

BACKGROUND

Lateral double-diffused metal-oxide-semiconductor (LDMOS) transistors are commonly used in high-voltage applications because of their high breakdown voltage characteristics. The layout geometry of a typical LDMOS transistor includes curved regions such as when the transistor is formed in loops, or when the LDMOS transistor is shaped in an oval or racetrack-like configuration with rectilinear portions between the curved regions.

It is well known that the layout geometry of an LDMOS transistor can have an adverse impact on device characteristics, such as the breakdown voltage, of the transistor. Specifically, when the layout geometry of an LDMOS transistor includes curved regions, the LDMOS transistor can suffer from a low breakdown voltage at the curved regions due to electric field crowding effects. Electric field crowding effects describe the conditions where the surface electric field of an LDMOS transistor is higher at the curved regions of the transistor as compared to the parallel rectilinear regions due to electric field crowding at the curved regions. Thus, the breakdown voltage of the overall LDMOS transistor is limited by the breakdown voltage of the curved regions.

Approaches for reducing the electric field crowding at the curved regions of an LDMOS transistor by altering the dimensions and the relative dimensions of the respective transistor features, undesirably introduce variations to device performance and alter device characteristics and functionality of the transistors. In general, increasing the breakdown voltage typically involves a higher on-state resistance ($R_{ON}$). An increase in on-state resistance of a transistor is undesirable, especially for high-voltage applications.

Therefore, it would be desirable to optimize the breakdown voltage characteristics of an LDMOS transistor over the entire layout geometry of the transistor without adversely impacting other device characteristics of the transistor.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 2A-2C are cross-sectional views each showing an exemplary embodiment of a lateral DMOS transistor according to the disclosure;

DESCRIPTION OF THE EMBODIMENTS

The disclosure is related to high voltage (HV) and ultra high voltage (UHV) semiconductor devices, and especially advantageously to those with operating voltages greater than 400 V. The disclosure is related to lateral DMOS, lateral double-diffused metal-oxide-semiconductor transistors. Such LDMOS transistors typically include an oval or racetrack-like orientation including a rectilinear region and a curved region but aspects of the disclosure also apply to other LDMOS transistor orientations such as round, or other ovoid or rectangular shapes. In conventional devices, the LDMOS transistor can suffer from low breakdown voltages at curved regions or in corner regions, due to electric field crowding effects.

The techniques and aspects of the disclosure have been effective in increasing breakdown voltages without using additional masks or additional processing operations. In one exemplary embodiment, a breakdown voltage of 800 V for a particular LDMOS transistor, was increased to about 950 V. Such values are illustrative only. The disclosure generally increases breakdown voltages, especially in locations at the curved regions, i.e. at the drain tip according to the trapped-drain configuration, where electric fields can lead to a reduction of breakdown voltage. The techniques and aspects of the disclosure have also been effective in increasing breakdown voltages without increasing on-state resistance.

High voltage lateral DMOS transistors formed in an oval or racetrack-like configuration typically include a source, a drain, and a gate electrode. The gate electrode is disposed partially over a thin gate dielectric and also extends partially over a thicker field oxide. In various exemplary embodiments, the HV or UHV LDMOS transistors may be formed in a trapped-source configuration. That is, the source region is enclosed by the gate electrode. In various other exemplary embodiments, the HV or other LDMOS transistors of the disclosure are made in a trapped-drain configuration where the drain region is enclosed by the gate, i.e. situated inside of the racetrack-like configuration. According to the trapped-drain configuration, the source region is immediately adjacent the outer portion of the gate electrode disposed over the gate dielectric and the drain is spaced a distance from the gate electrode. Although the figures illustrate the trapped-drain configuration and the description describes the exemplary trapped-drain configuration, it should be understood that the principles described herein, are equally applicable to the trapped-source configuration.

Figure 1:
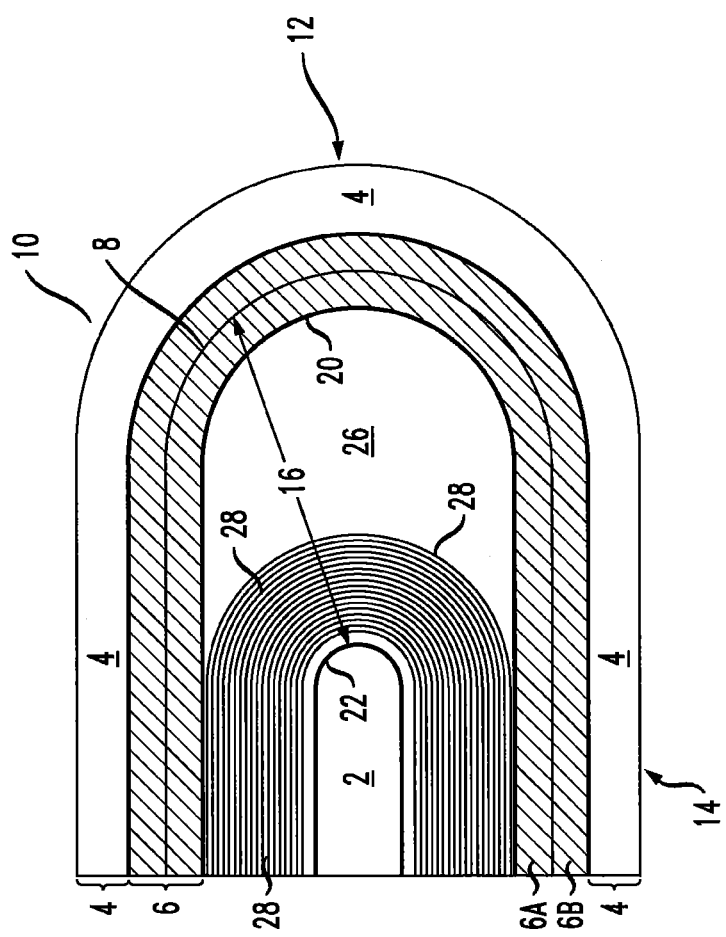
FIG. 1 is a plan view of an exemplary embodiment of a lateral DMOS transistor according to the disclosure.

FIG. 1 is a top view of LDMOS transistor 10 according to one embodiment of the disclosure. FIG. 1 illustrates the application of the schemes of the disclosure to an LDMOS transistor in a trapped-drain configuration. The LDMOS transistor may be a high voltage (HV) or ultra high voltage (UHV) LDMOS transistor that operates at a voltage of 400V or greater, according to various exemplary embodiments. Conductive gate 6 encloses drain region 2 in the configuration of FIG. 1 which shows a portion of an oval or racetrack-like configuration for LDMOS transistor 10. Although only a portion is illustrated in FIG. 1, LDMOS transistor 10 is formed in a complete oval or racetrack-like configuration.

Source 4 surrounds conductive gate 6 and the racetrack-like configuration includes curved region 12 and rectilinear region 14 of LDMOS transistor 10. Conductive gate 6 itself includes a curved portion in curved region 12 and a straight portion in rectilinear region 14. Conductive gate 6 is laterally spaced from drain region 2 as will be shown in more detail in FIGS. 2A-C. LDMOS transistor 10 may be formed on a semiconductor material such as a semiconductor substrate or an epitaxial or other layer of semiconductor material formed over a semiconductor or insulating substrate and includes a field oxide formed in region 16 which extends from boundary 22 of drain 2 to boundary 8 which is disposed beneath conductive gate 6. Conductive gate 6 therefore includes conductive gate portion 6A wherein conductive gate 6 is disposed over the field oxide, and conductive gate portion 6B in which conductive gate 6 is formed over a gate dielectric.

Each of source 4 and drain 2 may be n-type regions or p-type regions formed in a silicon layer, a silicon substrate or other semiconductor material. Source 4 and drain 2 may be formed in conjunction with various LDMOS transistor substructures. The substructure beneath source 4, conductive gate 6 and drain region 2 may include various wells and buried layers depending on technology and application.

Dielectric layers 26 are formed between inner boundary 20 of conductive gate 6 and boundary 22 of drain 2 and may include multiple dielectric layers or there may be only one dielectric layer in another exemplary embodiment. Isolated conductor leads 28 are disposed within or above one or more of the dielectric layers 26 and between conductive gate 6 and drain 2. Isolated conductive leads 28 may be formed of various metal materials, polysilicon, a combination of polysilicon and a metal material such as a polycide, or various other conductive materials. Isolated conductor leads 28 are isolated from one another and are floating structures, electrically. In the illustrated configuration, isolated conductor leads 28 include a curved portion and a rectilinear portion. The curved portion of isolated conductor leads 28 extends arcuately around drain 2 and in the illustrated embodiment represents a series of arcs of concentric circles but such is exemplary only. In other exemplary embodiments, isolated conductor leads 28 may, in curved region 14, each include the same radius of curvature and may be disposed so that they remain isolated from one another. Isolated conductor leads 28 formed in dielectric layers 26 are generally disposed over the field oxide and between conductive gate 6 and drain 2. In rectilinear region 14, isolated conductor leads 28 are essentially parallel to one another in the exemplary embodiment.

FIGS. 2A-2C show three exemplary embodiments, each of which may be represent a cross-section of the plan view of LDMOS transistor 10 shown in FIG. 1. Each of FIGS. 2A-2C includes source 4, drain 2 and conductive gate 6. Conductive gate 6 includes conductive gate portion 6B formed only over a gate dielectric. A gate dielectric, not clearly visible due to the scale of FIGS. 2A-2C, may be an oxide or other suitable gate dielectric materials used in LDMOS applications and particularly in high voltage LDMOS applications. Conductive gate portion 6A is disposed over field oxide 36 which is significantly thicker than a gate dielectric and is formed over semiconductor material 34 and extends from border 8 beneath conductive gate 6, to drain 2. As described above, in some embodiments, semiconductor material 34 is a semiconductor substrate. In other embodiments, semiconductor material 34 is an epitaxial or other layer of semiconductor material formed over a semiconductor or insulating substrate such as substrate 35 shown only in FIG. 2A, and in some embodiments, semiconductor material 34 has a first conductivity impurity type whereas substrate 35 has a second impurity type. Field oxide 36 may include a thickness of about 3300 Å to 3700 Å in various exemplary embodiments, but other thicknesses may be used in other exemplary embodiments. Dielectric layers 26 are formed over field oxide 36 and between conductive gate 6 and drain 2 and may include various and multiple layers of insulating materials used as inter-level dielectric, ILD, layers or intermetal dielectric, IMD, layers. Isolated conductor leads 28 are formed below, over or within one or more of the dielectric layers 26. In FIG. 2A, isolated conductor leads 28 are formed at two device levels. In FIG. 2B, isolated conductor leads 28 are formed at one device level, an upper device level disposed over interlevel dielectric layers 26, and in FIG. 2C, isolated conductor leads 28 are formed in one lower device level and disposed within dielectric layers 26. In each case, isolated conductor leads 28 are isolated from one another and floating electrically. The illustrated embodiment, in which the cross-sectional area of each of isolated conductor leads 28 is the same and in which isolated conductor leads are evenly spaced, is exemplary only. In other exemplary embodiments, isolated conductor leads 28 may be irregularly spaced from one another and include different widths.

One aspect of the disclosure is that isolated conductor leads 28 are formed without adding additional processing operations to the manufacture of the integrated circuit or other semiconductor device including the LDMOS transistor. Each of the device levels of isolated conductor leads 28 are formed from an existing conductive material layer by simply adding the isolated conductor leads 28 to the photomask used to define the indicated conductive material pattern such as used in other areas of the semiconductor device. Isolated conductor leads 28 are formed using the same processing operations that simultaneously form other device features in other areas of the semiconductor device that includes the LDMOS transistor 10.

In FIG. 2A, the lower of the two levels of isolated conductor leads 28 are formed from the same conductive layer used to form conductive features 40 and the upper of the two levels of isolated conductor leads 28 are formed from the same conductive layer as conductive features 44. According to one exemplary embodiment, conductive features 40 may be a metal 1 layer and conductive features 44 may be a metal 2 layer but other conductive layers may be utilized in other exemplary embodiments. In FIG. 2B, isolated conductor leads 28 are formed of the same conductive layer as conductive feature 44 and in FIG. 2C, isolated conductor leads 28 are formed of the same conductive layer as conductive feature 40.

Figure 3:
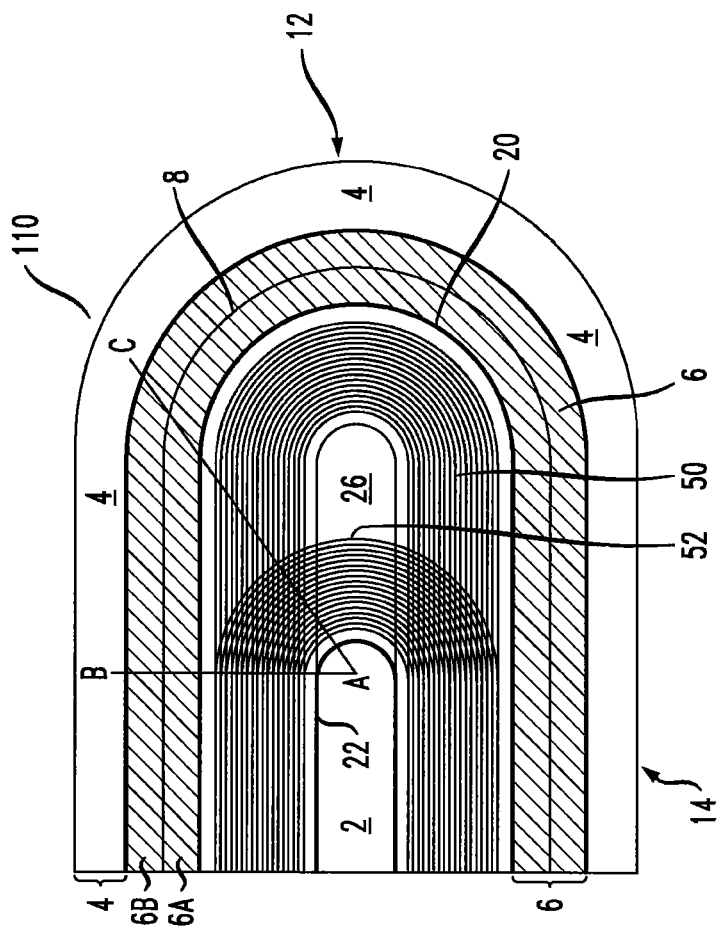
FIG. 3 is a plan view showing another exemplary embodiment of a lateral DMOS transistor according to the disclosure.

FIG. 3 is a plan view showing another exemplary embodiment of an LDMOS transistor according to the disclosure. LDMOS transistor 110 includes features as described in conjunction with FIGS. 1 and FIGS. 2A-2C. The LDMOS transistor illustrated in FIG. 3 includes two groups of isolated conductor leads: isolated conductor leads 50 and isolated conductor leads 52. Isolated conductor leads 50, 52 are each disposed within dielectric layers 26 and between conductive gate 6 and drain 2. Each of isolated conductive leads 50 and 52 include curved portions and parallel portions. Isolated conductive leads 50 include both curved and rectilinear, parallel portions in the curved portion 12 of LDMOS transistor 110. In each case, the curved portions may represent a series of arcs of concentric circles, as illustrated, but the curved sections may also take on other configurations such as conductive leads having the same radius of curvature, in other exemplary embodiments. Isolated conductor leads 50 and isolated conductor leads 52 will be formed at different device levels and isolated from one another by at least one layer of dielectric layers 26 and are electrically floating structures. Isolated conductor leads 50 and isolated conductor leads 52 represent only one exemplary embodiment of the various configurations of and combinations of floating isolated conductor leads that may be used.

Figure 4A:
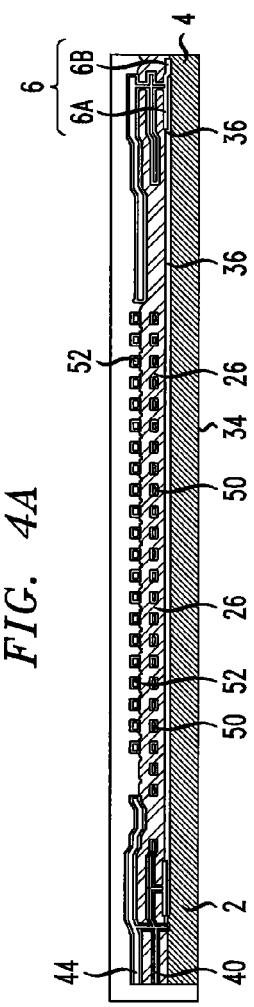
FIGS. 4A-C are cross-sectional views showing different exemplary embodiments of the lateral DMOS transistor generally shown in FIG. 3.
Figure 4B:
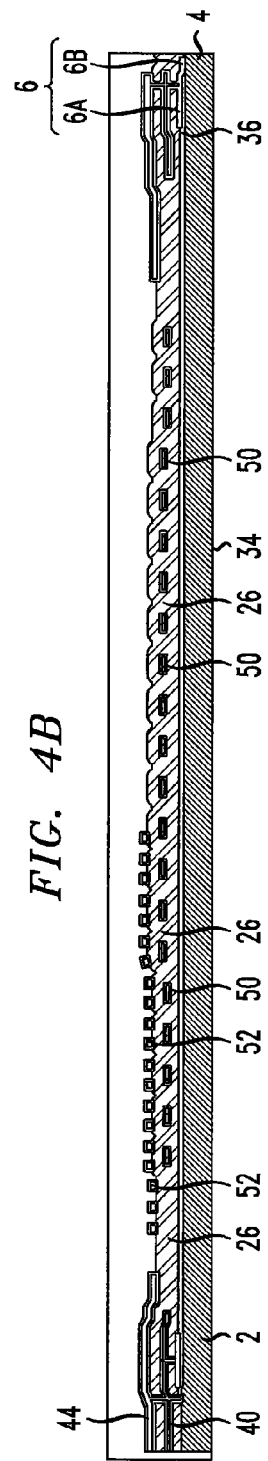
Figure 4C:
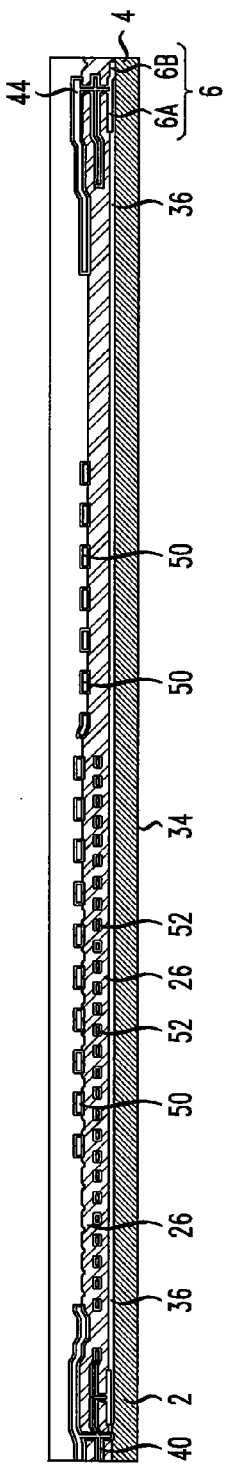

FIG. 4A is a cross-sectional view and may represent a view taken along line A-B of FIG. 3. FIGS. 4B and 4C are cross-sectional views, each of which may represent a cross-section of an exemplary embodiment of LDMOS transistor 110 taken along line A-C of FIG. 3. FIG. 4A shows the two groups of isolated conductor leads 50, 52 formed at different device levels, each group extending substantially from one location in the vicinity of drain 2, to a location in the vicinity of conductive gate 6. FIG. 4A illustrates that the groups of isolated conductor leads 50 and 52 essentially overlap each other along line A-B of FIG. 3. In the embodiment illustrated in FIG. 4A, isolated conductor leads 50 and 52 are generally straight and parallel to one another as can be seen in FIG. 3.

FIGS. 4B and 4C show isolated conductor leads 50 representing the only level of isolated conductor leads in the right-hand side of each of the drawings whereas in the left-hand side of the drawings illustrating the trapped-drain configuration, the group of isolated conductor leads 52 and the group of isolated conductor leads 50 essentially overlap each other. FIGS. 4B and 4C each represent a cross-sectional view in which isolated conductor leads 50 are essentially straight and parallel to one another and isolated conductor leads 52 are curved, as shown more clearly in FIG. 3. FIGS. 4B and 4C represent the two embodiments in which isolated conductor leads 50 represent the lower and upper, respectively, levels of isolated conductor leads. According to either exemplary embodiment, the lower and upper levels of isolated conductor leads are each disposed in or on dielectric layers 26. The layers of isolated conductor leads 50 and 52 may be separated by dielectric layers 26 and may be spaced apart by various distances determined by the spacing desired between corresponding metal layers from which conductive features 40 and conductive features 44 are formed.

Curved isolated conductor leads 52 may represent a series of arcs of concentric circles as illustrated in FIGS. 4B and 4C. In other exemplary embodiments, curved isolated conductor leads 52 may take on other configurations, such as conductive leads having the same radius of curvature. Substantially straight isolated conductor leads 50 appear wider in the cross-sectional views of FIGS. 4B and 4C because of the orientation of the cross-sectional cut along line A-C of FIG. 3, but the relative widths of isolated conductor leads 50 and 52 may be the same or they may vary in various exemplary embodiments.

Figure 5A:
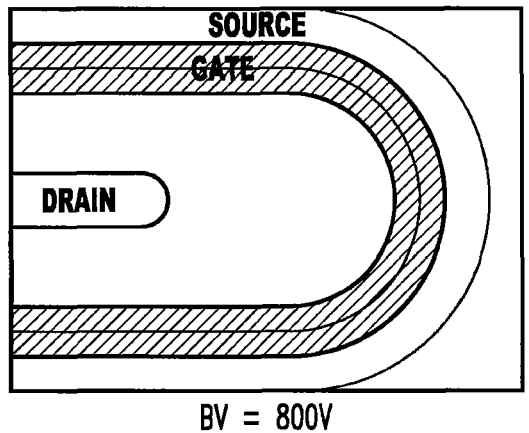
FIGS. 5A-5C show three different lateral DMOS transistors and associated breakdown voltages according to aspects of the disclosure.
Figure 5B:
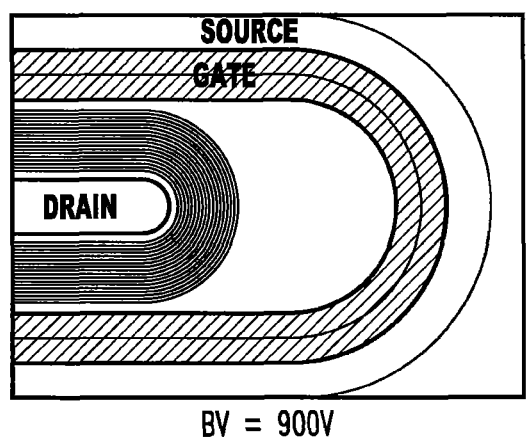
Figure 5C:
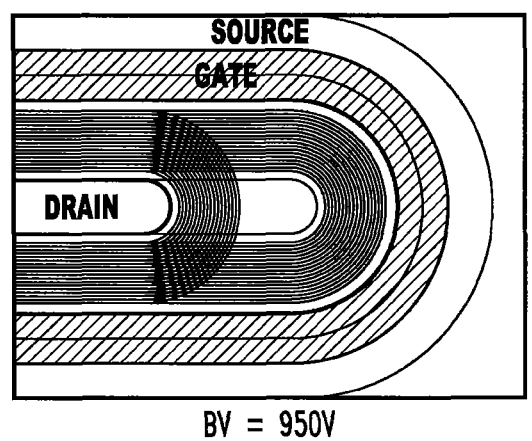

According to each of the described embodiments, applicants have found that electric field effects at the drain tip are reduced and breakdown voltages increased according to an aspect of the trapped-drain configuration of the disclosure. FIGS. 5A, 5B and 5C represent a comparison between an LDMOS structure of FIG. 5A without isolated conductor leads between the drain and gate, and two embodiments of the disclosure. FIG. 5B shows an exemplary embodiment similar to that shown in FIG. 1 and which includes one group of one or more levels of isolated conductor leads disposed between the gate and drain. FIG. 5C shows an exemplary embodiment similar to that illustrated in FIG. 3 and shows two groups of isolated conductor leads disposed between the drain and gate. Other than the difference in the presence and groupings of isolated conductor leads as noted, the LDMOS transistor structures shown in FIGS. 5A, 5B and 5C are essentially identical and are presented for comparative purposes. The figures also illustrate that the LDMOS transistor structure shown in FIG. 5A has a breakdown voltage, BV, of 800 V; the LDMOS transistor illustrated in FIG. 5B has a breakdown voltage, BV, of about 900 V and the LDMOS transistor structure shown in FIG. 5C has a breakdown voltage of about 950 V.

Aspects of the disclosure may be applied to HV or UHV LDMOS transistors having various substructures including the source and drain having various dopant concentrations and various dopant types. The source and drain regions may be oriented in various well arrangements and in arranged in various relations with respect to various transistor body configurations. The following device structures should then be understood to be exemplary and not limiting of the various environments in which the disclosure finds application.

According to one embodiment, the lateral DMOS transistor structure includes a semiconductor material of a first conductivity type. The semiconductor material has a first dopant concentration and a top surface. A conductive gate overlies and is insulated from the top surface of the semiconductor material by a gate dielectric. The conductive gate has a geometric shape including a rectilinear portion and a curved portion. A first region is formed in the semiconductor material, the first region being of the first conductivity type to form a drain region of the DMOS transistor according to a trapped-source configuration embodiment or a source region of the DMOS transistor according to a trapped-drain configuration embodiment. A second region is formed in the semiconductor material, the second region being of a second conductivity type to form a body region of the DMOS transistor. The second region may have a first end underlying the conductive gate, any remaining portion of the semiconductor material underlying the conductive gate being of the first conductivity type. A third region is formed in the semiconductor material, the third region being of the first conductivity type and forming a source region of the DMOS transistor according to a trapped-source configuration embodiment, or a drain region of the DMOS transistor according to the trapped-drain configuration embodiment. The third region is located within the second region. A field oxide region is disposed in and above the top surface of the semiconductor material and has a first end underlying the conductive gate, a second end abutting the first region and a thickness greater than a thickness of the gate dielectric.

According to another aspect, in the aforedescribed embodiment, the semiconductor material has a first dopant concentration and the first region of the first conductivity type has a second dopant concentration. The second region of a second conductivity type has a third dopant concentration. The third region of the first conductivity type and located within the second region, may include the second dopant concentration.

According to other embodiments, the doping characteristics and placement of source and drain regions may vary but an aspect of the disclosure is the presence of a plurality of isolated floating conductor leads disposed in a dielectric layer or layers disposed over the field oxide and between the gate and the drain, especially in the curved area near the tip of the trapped-drain or trapped-source.

According to one aspect, a lateral DMOS transistor structure is provided. The lateral DMOS transistor structure comprises a semiconductor material having a top surface and a conductive gate overlying and insulated from the top surface by at least a gate dielectric, the conductive gate having a geometric shape including a rectilinear portion and a curved portion in a curved region of the lateral DMOS transistor structure. The lateral DMOS transistor structure includes a source region formed in the semiconductor material; a drain region formed in the semiconductor material and spaced from the conductive gate; a field oxide region formed in and above the top surface, the field oxide region extending from the conductive gate to the drain region and having a thickness greater than a thickness of the gate dielectric; and an interlevel dielectric disposed between the conductive gate and the drain region and including a plurality of isolated floating conductor leads disposed therein or thereon, at least in the curved region.

According to another aspect, a semiconductor device is provided. The semiconductor device comprises a lateral DMOS transistor structure having an oval shape including opposed rectilinear regions and opposed curved regions and formed over a semiconductor substrate having a top surface. The lateral DMOS transistor structure comprises a conductive gate overlying and insulated from the top surface by at least a gate dielectric, the conductive gate including rectilinear gate portions and curved gate portions; a source region formed in the semiconductor substrate outside and adjacent the conductive gate; a trapped drain region formed in the semiconductor substrate, surrounded by and spaced from the conductive gate; an oxide region formed in and above the top surface, the oxide region including a thickness greater than a gate dielectric thickness and extending from the drain region to a location beneath the conductive gate; and dielectric material formed over the oxide and between the conductive gate and the drain region and including therein a lower group of conductive leads isolated from one another and formed at a lower device level and an upper group of conductive leads isolated from one another and formed at an upper device level.

A method for forming a lateral DMOS transistor structure is also provided. The method comprises providing a semiconductor substrate having a top surface; forming a conductive gate over and insulated from the top surface by at least a gate dielectric, the conductive gate having a geometric shape including a rectilinear gate portion and a curved gate portion; forming a source region in the semiconductor substrate extending downwardly from the top surface; and forming a drain region in the semiconductor substrate and extending downwardly from the top surface and laterally spaced from the conductive gate. The method further comprises forming a field oxide in and above the top surface in a field oxide region extending from the conductive gate to the drain region, the field oxide including a thickness greater than a thickness of the gate dielectric; forming a plurality of interlevel dielectric layers between the conductive gate and the drain region; and forming a plurality of isolated floating conductor leads in or on the interlevel dielectric between the drain region and the curved gate portion.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:
1. A transistor structure comprising:
a gate electrode,
a source region disposed outside said gate electrode;
a drain region formed inside said gate electrode;
a dielectric disposed between said gate electrode and said drain region; and,
a plurality of isolated floating conductor leads disposed in or on, or both in and on said dielectric, said plurality of isolated floating conductor leads disposed at multiple device levels such that at least some of said plurality of isolated floating conductor leads disposed at one device level cross completely over portions of said plurality of isolated floating conductor leads disposed at another device level.

2. The transistor structure as in claim 1, wherein said drain region is spaced from, and surrounded by, said gate electrode and straight portions of said gate electrode are parallel to one another.

3. The transistor structure as in claim 1, wherein said source region and said drain region are formed in a substrate having a top surface and further comprising a field oxide region formed in and above said top surface, said field oxide region extending from said gate electrode to said drain region.

4. The transistor structure as in claim 3, wherein said field oxide region has a first end underlying said gate electrode and a second end abutting said drain region and wherein said dielectric is disposed over at least a portion of said field oxide region.

5. The transistor structure as in claim 1, wherein said plurality of isolated floating conductor leads include parallel metal lead portions.

6. The transistor structure as in claim 1, wherein said plurality of isolated floating conductor leads comprise evenly spaced metal leads.

7. The transistor structure as in claim 1, wherein said gate electrode extends arcuately around said drain region, and said source region extends arcuately around said gate electrode.

8. The transistor structure as in claim 1, wherein each of said plurality of isolated floating conductor leads comprise a curved portion having a radius of curvature.

9. The transistor structure as in claim 1, wherein each of said plurality of isolated floating conductor leads comprise a straight portion parallel to one another and said plurality of isolated floating conductor leads comprise metal leads.

10. A transistor structure comprising:
   a semiconductor material having a top surface;
   a conductive gate overlying and insulated from said top surface by at least a gate dielectric, said conductive gate including a curved portion;
   a source region formed in said semiconductor material;
   a drain region formed in said semiconductor material and spaced from said conductive gate;
   an interlevel dielectric disposed between said conductive gate and said drain region and including a plurality of isolated floating conductor leads disposed therein or thereon,
   wherein said plurality of isolated floating conductor leads are disposed at one level and cross completely over a portion of a conductive material pattern disposed at a different level.

11. The transistor structure as in claim 10, further comprising a field oxide region formed in and above said top surface, said field oxide region extending from said conductive gate to said drain region, having a thickness greater than a thickness of said gate dielectric, and having a first end underlying said conductive gate and a second end abutting said drain region and wherein said interlevel dielectric is disposed over at least a portion of said field oxide region.

12. The transistor structure as in claim 10, wherein said plurality of isolated floating conductor leads include parallel metal lead portions.

13. The transistor structure as in claim 10, wherein said plurality of isolated floating conductor leads comprise evenly spaced apart metal leads and said metal leads disposed at said one level are curved metal leads.

14. The transistor structure as in claim 10, wherein said interlevel dielectric comprises a plurality of layers of dielectric material and said plurality of isolated floating conductor leads comprise metal leads formed on or in multiple layers of said plurality of layers of dielectric material.

15. The transistor structure as in claim 10, wherein said plurality of isolated floating conductor leads each comprise a metal lead having a curved section in a rectilinear section.

16. A semiconductor device comprising a transistor structure having a shape including opposed rectilinear regions and opposed curved regions and formed over a semiconductor substrate having a top surface, said transistor structure comprising:
   a conductive gate overlying said top surface and insulated from said top surface by a gate dielectric, said conductive gate including rectilinear gate portions and curved gate portions;
   a source region formed in said semiconductor substrate outside said conductive gate;
   a drain region formed in said semiconductor substrate and spaced from and surrounded by said conductive gate;
   an oxide region formed in and above said top surface and extending at least partially beneath said conductive gate; and
   a dielectric material formed over said oxide region and between said conductive gate and said drain region and including therein a lower group of conductive leads isolated from one another and an upper group of conductive leads isolated from one another, disposed over the lower group of conductive leads, and overlapping at least portions of said lower group of conductive leads,
   wherein said lower group of conductive leads includes lower conductive leads between said drain region and said curved gate portions and said upper group of conductive leads includes upper conductive leads between said drain portion and said curved gate portions, and wherein said upper conductive leads overlap said lower conductive leads.

17. The semiconductor device as in claim 16, wherein each of said lower conductive leads of said lower group of conductive leads includes a curved portion.

18. The semiconductor device as in claim 17, wherein each of said lower conductive leads of said lower group of conductive leads includes a linear portion.

19. The semiconductor device as in claim 16, wherein said lower conductive leads comprise a plurality of evenly spaced-apart arcuate metal leads that include a series of arcs of concentric circles.

20. The semiconductor device as in claim 16, wherein said upper conductive leads comprise a plurality of evenly spaced apart arcuate metal leads that include a series of arcs of concentric circles.

* * * * *